United States Patent [19]
Pawlowski

[11] Patent Number: 5,890,198
[45] Date of Patent: Mar. 30, 1999

[54] INTELLIGENT REFRESH CONTROLLER FOR DYNAMIC MEMORY DEVICES

[75] Inventor: J. Thomas Pawlowski, Boise, Id.

[73] Assignee: Micron Technology, Inc., Boise, Id.

[21] Appl. No.: 735,324

[22] Filed: Oct. 22, 1996

[51] Int. Cl.⁶ .................................................. G06F 12/16
[52] U.S. Cl. ........................................ 711/106; 365/222
[58] Field of Search .................... 711/106, 105; 365/222

[56] References Cited

U.S. PATENT DOCUMENTS

| | | | |
|---|---|---|---|
| 4,357,686 | 11/1982 | Scheuneman | 365/222 |
| 4,625,301 | 11/1986 | Berger | 365/222 |
| 4,982,369 | 1/1991 | Tatematsu | 365/222 |
| 5,278,797 | 1/1994 | Jeon et al. | 365/222 |
| 5,465,367 | 11/1995 | Reddy et al. | 365/222 |
| 5,469,559 | 11/1995 | Parks et al. | 711/106 |
| 5,475,645 | 12/1995 | Wada | 365/222 |
| 5,485,429 | 1/1996 | Ono | 365/222 |
| 5,495,452 | 2/1996 | Cha | 365/222 |
| 5,499,213 | 3/1996 | Niimi et al. | 365/222 |
| 5,500,827 | 3/1996 | Yazdy et al. | 365/222 |
| 5,507,005 | 4/1996 | Kojima et al. | 395/872 |
| 5,511,176 | 4/1996 | Tsuha | 711/106 |

FOREIGN PATENT DOCUMENTS

| | | |
|---|---|---|
| 58-125294 | 7/1983 | Japan . |
| 60-083293 | 5/1985 | Japan . |
| 07254272 | 10/1995 | Japan . |
| 08007562 | 1/1996 | Japan . |
| WO 95/20224 | 7/1995 | WIPO . |

Primary Examiner—Eddie P. Chan
Assistant Examiner—Kevin L. Ellis
Attorney, Agent, or Firm—Thorp, Reed & Armstrong

[57] ABSTRACT

A device and method for generating a refresh signal for use in a dynamic memory having an array of memory cells organized according to addresses, the device including a refresh data memory array, a write driver circuit responsive to a refresh signal and timing information for writing at least a portion of the timing information in the refresh data memory array according to addresses corresponding to addresses used in the array of memory cells, a circuit for reading the written timing information from the refresh data memory array corresponding to certain of the addresses, and a logic circuit responsive to the present value of the timing information and said read timing information for producing said refresh signal indicative of when a refresh is required.

33 Claims, 9 Drawing Sheets

| 4-bit COUNTER | | | | LOW PRIORITY REFRESH (active low) | HIGH PRIORITY REFRESH (active high) | R.D.M.A. data out | REFRESH MAY BE REQUIRED (active low) | PENDING EXTERNAL OPERATION | SELECT A (DRAM) | SELECT A (R.D.M.A.) | WRITE ENABLE |
|---|---|---|---|---|---|---|---|---|---|---|---|
| bit 3 | bit 2 | bit 1 | bit 0 | | | | | | | | |
| 0 | 0 | 0 | 0 | 1 | 1 | 0 | 0 | 0 | 0 | 1 | 0 |
| 0 | 0 | 0 | 1 | 1 | 1 | 0 | 0 | 0 | 0 | 1 | 0 |
| 0 | 0 | 1 | 0 | 1 | 1 | 0 | 0 | 0 | 0 | 1 | 0 |
| 0 | 0 | 1 | 1 | 1 | 1 | 0 | 0 | 0 | 0 | 1 | 0 |
| 0 | 1 | 0 | 0 | 1 | 1 | 0 | 0 | 0 | 0 | 1 | 0 |
| 0 | 1 | 0 | 1 | 1 | 1 | 0 | 0 | 0 | 0 | 1 | 0 |
| 0 | 1 | 1 | 0 | 0 | 1 | 0 | 0 | 0 | 1 | 1 | 1 |
| 0 | 0 | 1 | 1 | 1 | 0 | 0 | 0 | 0 | 1 | 1 | 1 |
| 1 | 0 | 0 | 0 | 1 | 1 | 0 | 1 | 0 | 0 | 1 | 0 |
| 1 | 0 | 0 | 1 | 1 | 1 | 0 | 1 | 0 | 0 | 1 | 0 |
| 1 | 0 | 1 | 0 | 1 | 1 | 0 | 1 | 0 | 0 | 1 | 0 |
| 1 | 0 | 1 | 1 | 1 | 1 | 0 | 1 | 0 | 0 | 1 | 0 |
| 1 | 1 | 0 | 0 | 1 | 1 | 0 | 1 | 0 | 0 | 1 | 0 |
| 1 | 1 | 0 | 1 | 1 | 1 | 0 | 1 | 0 | 0 | 1 | 0 |
| 1 | 1 | 1 | 0 | 0 | 1 | 0 | 1 | 0 | 0 | 1 | 0 |
| 1 | 1 | 1 | 1 | 1 | 0 | 0 | 1 | 0 | 0 | 1 | 0 |
| 0 | 0 | 0 | 0 | 1 | 1 | 0 | 0 | 1 | 0 | 0 | 1 |
| 0 | 0 | 0 | 1 | 1 | 1 | 0 | 0 | 1 | 0 | 0 | 1 |
| 0 | 0 | 1 | 0 | 1 | 1 | 0 | 0 | 1 | 0 | 0 | 1 |
| 0 | 0 | 1 | 1 | 1 | 1 | 0 | 0 | 1 | 0 | 0 | 1 |
| 0 | 1 | 0 | 0 | 1 | 1 | 0 | 0 | 1 | 0 | 0 | 1 |
| 0 | 1 | 0 | 1 | 1 | 1 | 0 | 0 | 1 | 0 | 0 | 1 |
| 0 | 1 | 1 | 0 | 0 | 1 | 0 | 0 | 1 | 0 | 0 | 1 |
| 0 | 1 | 1 | 1 | 1 | 0 | 0 | 0 | 1 | 1 | 1 | 1 |
| 1 | 0 | 0 | 0 | 1 | 1 | 0 | 1 | 1 | 0 | 0 | 1 |
| 1 | 0 | 0 | 1 | 1 | 1 | 0 | 1 | 1 | 0 | 0 | 1 |
| 1 | 0 | 1 | 0 | 1 | 1 | 0 | 1 | 1 | 0 | 0 | 1 |
| 1 | 0 | 1 | 1 | 1 | 1 | 0 | 1 | 1 | 0 | 0 | 1 |
| 1 | 1 | 0 | 0 | 1 | 1 | 0 | 1 | 1 | 0 | 0 | 1 |
| 1 | 1 | 0 | 1 | 1 | 1 | 0 | 1 | 1 | 0 | 0 | 1 |
| 1 | 1 | 1 | 0 | 0 | 1 | 0 | 1 | 1 | 0 | 0 | 1 |
| 1 | 1 | 1 | 1 | 1 | 0 | 0 | 1 | 1 | 0 | 0 | 1 |

*FIG. 3A*

| 4-bit COUNTER | | | | LOW PRIORITY REFRESH (active low) | HIGH PRIORITY REFRESH (active high) | R.D.M.A. data out | REFRESH MAY BE REQUIRED (active low) | PENDING EXTERNAL OPERATION | SELECT A (DRAM) | SELECT A (R.D.M.A.) | WRITE ENABLE |
|---|---|---|---|---|---|---|---|---|---|---|---|
| bit 3 | bit 2 | bit 1 | bit 0 | | | | | | | | |
| 0 | 0 | 0 | 0 | 1 | 1 | 1 | 1 | 0 | 0 | 1 | 0 |
| 0 | 0 | 0 | 1 | 1 | 1 | 1 | 1 | 0 | 0 | 1 | 0 |
| 0 | 0 | 1 | 0 | 1 | 1 | 1 | 1 | 0 | 0 | 1 | 0 |
| 0 | 0 | 1 | 1 | 1 | 1 | 1 | 1 | 0 | 0 | 1 | 0 |
| 0 | 1 | 0 | 0 | 1 | 1 | 1 | 1 | 0 | 0 | 1 | 0 |
| 0 | 1 | 0 | 1 | 1 | 1 | 1 | 1 | 0 | 0 | 1 | 0 |
| 0 | 1 | 1 | 0 | 0 | 1 | 1 | 1 | 0 | 0 | 1 | 0 |
| 0 | 1 | 1 | 1 | 1 | 0 | 1 | 1 | 0 | 0 | 1 | 0 |
| 1 | 0 | 0 | 0 | 1 | 1 | 1 | 0 | 0 | 0 | 1 | 0 |
| 1 | 0 | 0 | 1 | 1 | 1 | 1 | 0 | 0 | 0 | 1 | 0 |
| 1 | 0 | 1 | 0 | 1 | 1 | 1 | 0 | 0 | 0 | 1 | 0 |
| 1 | 0 | 1 | 1 | 1 | 1 | 1 | 0 | 0 | 0 | 1 | 0 |
| 1 | 1 | 0 | 0 | 1 | 1 | 1 | 0 | 0 | 0 | 1 | 0 |
| 1 | 1 | 0 | 1 | 1 | 1 | 1 | 0 | 0 | 0 | 1 | 0 |
| 1 | 1 | 1 | 0 | 0 | 1 | 1 | 0 | 0 | 1 | 1 | 1 |
| 1 | 1 | 1 | 1 | 1 | 0 | 1 | 0 | 0 | 1 | 1 | 1 |
| 0 | 0 | 0 | 0 | 1 | 1 | 1 | 1 | 1 | 0 | 0 | 1 |
| 0 | 0 | 0 | 1 | 1 | 1 | 1 | 1 | 1 | 0 | 0 | 1 |
| 0 | 0 | 1 | 0 | 1 | 1 | 1 | 1 | 1 | 0 | 0 | 1 |
| 0 | 0 | 1 | 1 | 1 | 1 | 1 | 1 | 1 | 0 | 0 | 1 |
| 0 | 1 | 0 | 0 | 1 | 1 | 1 | 1 | 1 | 0 | 0 | 1 |
| 0 | 1 | 0 | 1 | 1 | 1 | 1 | 1 | 1 | 0 | 0 | 1 |
| 0 | 1 | 1 | 0 | 0 | 1 | 1 | 1 | 1 | 0 | 0 | 1 |
| 0 | 1 | 1 | 1 | 1 | 0 | 1 | 1 | 1 | 0 | 0 | 1 |
| 1 | 0 | 0 | 0 | 1 | 1 | 1 | 0 | 1 | 0 | 0 | 1 |
| 1 | 0 | 0 | 1 | 1 | 1 | 1 | 0 | 1 | 0 | 0 | 1 |
| 1 | 0 | 1 | 0 | 1 | 1 | 1 | 0 | 1 | 0 | 0 | 1 |
| 1 | 0 | 1 | 1 | 1 | 1 | 1 | 0 | 1 | 0 | 0 | 1 |
| 1 | 1 | 0 | 0 | 1 | 1 | 1 | 0 | 1 | 0 | 0 | 1 |
| 1 | 1 | 0 | 1 | 1 | 1 | 1 | 0 | 1 | 0 | 0 | 1 |
| 1 | 1 | 1 | 0 | 0 | 1 | 1 | 0 | 1 | 0 | 0 | 1 |
| 1 | 1 | 1 | 1 | 1 | 0 | 1 | 0 | 1 | 1 | 1 | 1 |

*FIG. 3B*

| SEQUENCE REFERENCE | 3-BIT COUNTER COUNTER VALUE | OPERATION | ELAPSED TIME(ms) | COMMENTS |
|---|---|---|---|---|
| 1 | 0 | WRITE TO ROW | 0 | |
| 2 | 1 | | 3 | |
| 3 | 2 | | 6 | |
| 4 | 3 | | 9 | |
| 5 | 4 | | 12 | CAN REFRESH ANYTIME NOW |
| 6 | 5 | REFRESH | 15 | REFRESH MUST OCCUR |
| 7 | 0 | | 3 | COUNTER MUST WRAP |
| 8 | 1 | | 6 | |
| 9 | 2 | | 9 | |
| 10 | 3 | | 12 | |
| 11 | 4 | | 15 | |
| 12 | 5 | | 18 | THIS IS TOO LATE |
| 13 | 0 | | 21 | |
| 14 | 1 | | 24 | |
| 15 | 2 | | 27 | |
| 16 | 3 | | 30 | |

*FIG. 4A*

| SEQUENCE REFERENCE | 3-BIT COUNTER COUNTER VALUE | OPERATION | ELAPSED TIME(ms) | COMMENTS |
|---|---|---|---|---|
| 20 | 0 | WRITE TO ROW | 0 | |
| 21 | 1 | | 1.9375 | |
| 22 | 2 | | 3.875 | |
| 23 | 3 | | 5.8125 | |
| 24 | 4 | | 7.75 | |
| 25 | 5 | | 9.6875 | |
| 26 | 6 | | 11.625 | CAN REFRESH ANYTIME NOW |
| 27 | 7 | REFRESH | 13.5625 | REFRESH BECOMES HIGH PRIORITY |
| 28 | 0 | | 1.9375 | COUNTER WRAPS |
| 29 | 1 | | 3.875 | |
| 30 | 2 | | 5.8125 | |
| 31 | 3 | | 7.75 | |
| 32 | 4 | | 9.6875 | |
| 33 | 5 | | 11.625 | |
| 34 | 6 | | 13.5625 | CAN REFRESH ANYTIME NOW |
| 35 | 7 | REFRESH | 15.5 | REFRESH BECOMES HIGH PRIORITY |
| 36 | 0 | | 1.9375 | |

*FIG. 4B*

| SEQUENCE REFERENCE | 4-BIT COUNTER COUNTER VALUE | OPERATION | ELAPSED TIME(ms) | COMMENTS |
|---|---|---|---|---|
| 1 | 0 | WRITE TO ROW | 0 | |
| | | WRITE 1 TO RDA | | |
| 2 | 1 | | 0.96875 | |
| 3 | 2 | | 1.9375 | |
| 4 | 3 | | 2.90625 | |
| 5 | 4 | | 3.875 | |
| 6 | 5 | | 4.84375 | |
| 7 | 6 | | 5.8125 | |
| 8 | 7 | | 6.78125 | |
| 9 | 8 | | 7.75 | |
| 10 | 9 | | 8.71875 | |
| 11 | 10 | | 9.6875 | |
| 12 | 11 | | 10.65625 | |
| 13 | 12 | | 11.625 | |
| 14 | 13 | | 12.59375 | |
| 15 | 14 | | 13.5625 | REFRESH = LOW PRIORITY |
| 16 | 15 | REFRESH | 14.53125 | REFRESH = HIGH PRIORITY |
| 17 | 0 | | 0.96875 | |
| 18 | 1 | | 1.9375 | |
| 19 | 2 | | 2.90625 | |
| 20 | 3 | | 3.875 | |
| 21 | 4 | | 4.84375 | |
| 22 | 5 | | 5.8125 | |
| 23 | 6 | | 6.78125 | |
| 24 | 7 | | 7.75 | |
| 25 | 8 | | 8.71875 | |
| 26 | 9 | | 9.6875 | |
| 27 | 10 | | 10.65625 | |
| 28 | 11 | | 11.625 | |
| 29 | 12 | | 12.59375 | |
| 30 | 13 | | 13.5625 | |
| 31 | 14 | | 14.53125 | REFRESH = LOW PRIORITY |
| 32 | 15 | REFRESH | 15.5 | REFRESH = HIGH PRIORITY |

| SEQUENCE REFERENCE | 4-BIT COUNTER COUNTER VALUE | OPERATION | ELAPSED TIME(ms) | COMMENTS |
|---|---|---|---|---|
| 1 | 0 | | | |
| 2 | 1 | | | |
| 3 | 2 | | | |
| 4 | 3 | | | |
| 5 | 4 | | | |
| 6 | 5 | WRITE TO ROW | 0 | THIS EXAMPLE SHOWS WHAT HAPPENS |
| | | WRITE 01 BINARY TO RDA | | WHEN THE WRITE IS NOT AT COUNT=0 |
| 7 | 6 | | 0.96875 | |
| 8 | 7 | | 1.9375 | |
| 9 | 8 | | 2.90625 | |
| 10 | 9 | | 3.875 | |
| 11 | 10 | | 4.84375 | |
| 12 | 11 | | 5.8125 | |
| 13 | 12 | | 6.78125 | |
| 14 | 13 | | 7.75 | |
| 15 | 14 | | 8.71875 | |
| 16 | 15 | | 9.6875 | |
| 17 | 0 | | 10.65625 | |
| 18 | 1 | | 11.625 | |
| 19 | 2 | | 12.59375 | |
| 20 | 3 | | 13.5625 | |
| 21 | 4 | | 14.53125 | REFRESH = LOW PRIORITY |
| 22 | 5 | REFRESH | 15.5 | REFRESH = HIGH PRIORITY |
| 23 | 6 | | 0.96875 | |
| 24 | 7 | | 1.9375 | |
| 25 | 8 | | 2.90625 | |
| 26 | 9 | | 3.875 | |
| 27 | 10 | | 4.84375 | |
| 28 | 11 | | 5.8125 | |
| 29 | 12 | | 6.78125 | |
| 30 | 13 | | 7.75 | |
| 31 | 14 | | 8.71875 | |
| 32 | 15 | | 9.6875 | |
| 33 | 0 | | 10.65625 | |
| 34 | 1 | | 11.625 | |
| 35 | 2 | | 12.59375 | |
| 36 | 3 | | 13.5625 | |
| 37 | 4 | | 14.53125 | REFRESH = LOW PRIORITY |
| 38 | 5 | REFRESH | 15.5 | REFRESH = HIGH PRIORITY |
| 39 | 6 | | 0.96875 | |

| SEQUENCE REFERENCE | 4-BIT COUNTER COUNTER VALUE | OPERATION | ELAPSED TIME(ms) | COMMENTS |
|---|---|---|---|---|
| 1 | 0 | | | |
| 2 | 1 | | | |
| 3 | 2 | | | |
| 4 | 3 | | | |
| 5 | 4 | | | |
| 6 | 5 | WRITE TO ROW | 0 | THIS EXAMPLE SHOWS WHAT HAPPENS |
| | | WRITE 1 BINARY TO RDA | | WHEN THE WRITE IS NOT AT COUNT=0 |
| 7 | 6 | | 0.96875 | |
| 8 | 7 | | 1.9375 | |
| 9 | 8 | | 2.90625 | |
| 10 | 9 | | 3.875 | |
| 11 | 10 | | 4.84375 | |
| 12 | 11 | | 5.8125 | |
| 13 | 12 | | 6.78125 | |
| 14 | 13 | | 7.75 | |
| 15 | 14 | | 8.71875 | LOGIC SAYS REFRESH = LOW PRIORITY |
| 16 | 15 | REFRESH | 9.6875 | LOGIC SAYS REFRESH = HIGH PRIORITY |
| 17 | 0 | | 0.96875 | |
| 18 | 1 | | 1.9375 | |
| 19 | 2 | | 2.90625 | |
| 20 | 3 | | 3.875 | |
| 21 | 4 | | 4.84375 | |
| 22 | 5 | | 5.8125 | |
| 23 | 6 | | 6.78125 | |
| 24 | 7 | | 7.75 | |
| 25 | 8 | | 8.71875 | |
| 26 | 9 | | 9.6875 | |
| 27 | 10 | | 10.65625 | |
| 28 | 11 | | 11.625 | |
| 29 | 12 | | 12.59375 | |
| 30 | 13 | | 13.5625 | |
| 31 | 14 | | 14.53125 | REFRESH = LOW PRIORITY |
| 32 | 15 | REFRESH | 15.5 | REFRESH = HIGH PRIORITY |

*FIG. 8*

INTELLIGENT REFRESH CONTROLLER FOR DYNAMIC MEMORY DEVICES

BACKGROUND OF THE INVENTION

1. Field of the Invention

The present invention relates generally to solid state memory devices and, more particularly, to the refresh requirements of dynamic random access memories (DRAM).

2. Description of the Background

The simplest configuration for a DRAM is a memory cell comprised of one transistor which operates in conjunction with a capacitor. The transistor is connected across a bit line and the capacitor, and is gated by a wordline. The other plate of the capacitor is connected to a common circuit plate. A write operation is performed by placing data on the bit line and gating the data into the capacitor with the wordline. A read operation is performed by precharging the bit line and raising the wordline. Charge sharing, occurring between the cell's capacitor and the bit line, changes the voltage on the bit line by between 5% and 30%, while the information in the cell is destroyed. Thus, a read operation must be accompanied by a write back to ensure the integrity of the data.

DRAM cells are extremely small because they require only a single transistor and a single capacitor. Therefore, very high density DRAMs can be fabricated. Densities can be increased even further by constructing the capacitor in a vertical direction, e.g., a trench capacitor, as opposed to a planar direction. Because of their high density, DRAMs can often be fabricated at lower costs than other types of memory cells.

One characteristic associated with DRAMs is that the voltage stored on the capacitor of an individual cell tends to dissipate over time as a result of leakage currents. Because the difference between a voltage which represents a logic 1 and a voltage which represents a logic 0 is very small, each cell of the DRAM must be periodically refreshed to ensure the accuracy of the data stored therein. Despite the need to refresh the data, DRAMs are widely used because of their lower cost.

A refresh operation generally comprises copying the data held in certain of the memory cells into one or more registers and then copying the data back into the memory cells from the registers. Traditionally, that refresh requirement has required additionally circuitry. A memory controller, or perhaps the system processor, intercedes between successive read and write operations to initiate the refresh in a forced manner. Forced refresh operations result in delaying subsequent read or write operations.

More recently, DRAMs have been proposed which have a self-refresh mode for executing the refresh process. In such DRAMs, a refresh signal does not need to be generated by the memory controller or system processor. DRAMs having self-refresh capability include a circuit specifically designed for initiating and carrying out the refresh operation.

Nevertheless, whether the refresh is initiated by a device external to the DRAM or internal to the DRAM, the systematic reading and writing back of information from each cell within the array consumes both power and time. Thus, the need exists, for adding intelligence to the refresh decision in a manner which does not unduly complicate the DRAM circuit.

SUMMARY OF THE INVENTION

The present invention is directed to an intelligent refresh controller which keeps track of when a row of cells in a memory device is in need of a refresh operation. That is accomplished by adding one, or more, extra memory cells per row. That extra cell is referred to herein as the refresh data memory cell. A clock, either internally generated or externally supplied, generates timing information. One or more of the bits are stored in the refresh data memory cells for each row. The timing information stored in the refresh data memory cell is updated whenever the row associated with that cell is read or written. The portion of the timing information stored in each row is compared to the current timing information to determine how near that row is to the time when the memory cells lose data integrity. Thus, that comparison provides an indication of when a refresh is required.

A counter plus a logic circuit may be added to improve arbitration capability. Specifically, the logic is used to prioritize the urgency of processing an external request versus the need to perform an immediate refresh. When no externally supplied requests are pending, the row refresh data cells are scanned and compared to the current timing information to determine if a refresh is needed in the currently scanned row. If a refresh is deemed necessary, the refresh is performed. If an externally supplied request is pending, the prioritization logic determines if the refresh or the external request should take precedence.

Timing information can be generated internally through the use of a clock, frequency dividers, and a counter. Those devices may be sized so as to guaranty that all rows within the memory array can be refreshed before data loss occurs under all conditions.

The refresh data cells are updated whenever the row is accessed, either as initiated by the refresh controller or when an external request is executed. The net result is that refresh only occurs when necessary. If the row has been accessed for either a read or a write operation, the "count down" to the next required refresh operation begins anew. Unnecessary refreshes are avoided because rows which have been recently accessed are not refreshed.

Memory and bandwidth loss due to refresh operations are minimized as a result of the present invention because the present invention prioritizes memory operations above refresh operations except when refreshing a device becomes time critical. Non-intelligent refresh controls blindly refresh whole rows each refresh period, whether or not the operation is necessary. That reduces memory availability. That problem is solved by the present invention by renewing the refresh data memory cell contents whenever the row is accessed, thus reducing the frequency of refresh. Those advantages and benefits of the present invention, and others, will become apparent from the Description of the Preferred Embodiments hereinbelow.

BRIEF DESCRIPTION OF THE DRAWINGS

For the present invention to be clearly understood and readily practiced, the present invention will be described in conjunction with the following figures wherein:

FIGS. 3A and 3B are a spread sheet illustrating all the possible states for the refresh controller of FIG. 2.

FIGS. 4A and 4B are tables illustrating refresh times for the circuit of FIG. 2 assuming the use of a three bit counter;

FIG. 5 is a table illustrating refresh times for the circuit of FIG. 2 assuming the use of a four bit counter;

FIG. 7 is a table illustrating refresh times for the circuit of FIG. 6; and

FIG. 8 is a table illustrating refresh times for the circuit of FIG. 2 for the same circumstances illustrated in FIG. 7.

DESCRIPTION OF THE PREFERRED EMBODIMENTS

Figure 1:
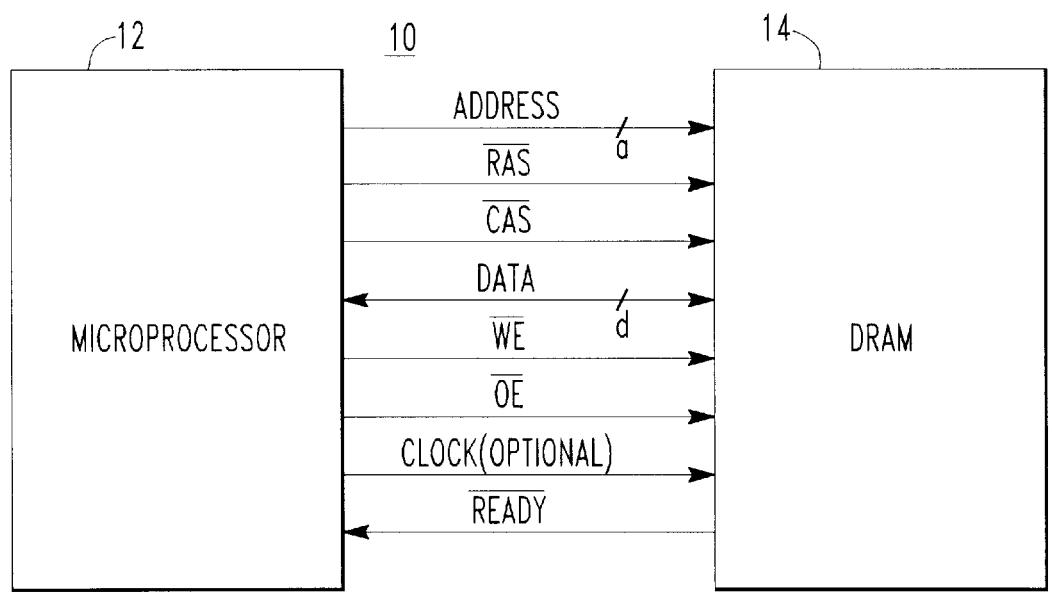
FIG. 1 illustrates a block diagram of a system using EPM or EDO DRAM with an integrated refresh controller constructed according to the teachings of the present invention.

FIG. 1 illustrates a block diagram of a system 10 comprised of a microprocessor, microcontroller, ASIC, etc. 12 in communication with a dynamic random access memory (DRAM) 14. The DRAM 14 may be, for example, either an EPM or EDO type of memory having an integrated refresh controller constructed according to the teachings of the present invention.

Figure 2:
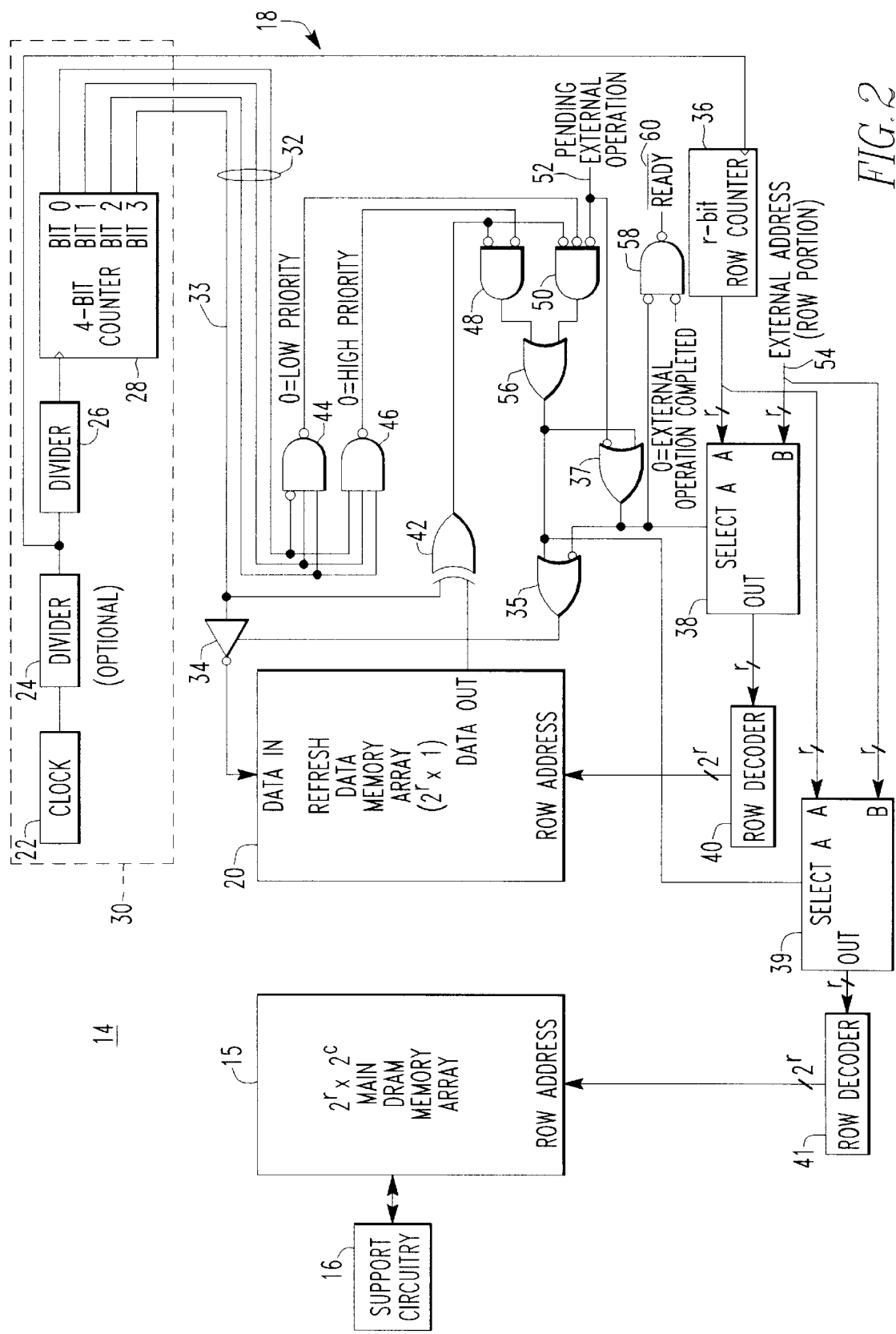
FIG. 2 illustrates a DRAM having a refresh controller constructed according to the teachings of the present invention and which provides one bit of refresh data per row.

Turning to FIG. 2, a more detailed diagram of the DRAM 14 is illustrated. The DRAM 14 is comprised of a main memory array 15 and support circuitry 16. Those of ordinary skill in the art will recognize that support circuitry 16 includes data buffers, write drivers, sense amplifiers, column decoders, etc. necessary to write information into and read information from main memory array 15. A row decoder 41 is also needed to perform read and write operations on the main array 15. The components comprising the support circuitry 16 are not disclosed in detail as they do not form a feature of the present invention.

The remainder of the components illustrated in FIG. 2 comprise a refresh controller generally designated by the numeral 18. The refresh controller 18 includes a refresh data memory array 20 which provides at least one extra memory cell per row. With the cells of the main memory array 15 arranged in rows and columns, and with each row being accessed through the use of an address, the refresh data memory array is organized so that one refresh data memory cell is associated with each addressable row in the main memory array 15. Although the refresh data memory array 20 is illustrated as a separate array, those of ordinary skill in the art will recognize that the memory space required by the array 20 can be provided within the array 15.

A clock 22, which operates as a source of clock pulses, an optional divider 24, a second divider 26, and a 4-bit counter 28 are interconnected in a well known manner so as to produce a timing circuit 30 which produces timing information 32. The timing information 32 takes the form of a multi-bit signal which in the illustrated case is four bits. Alternatively, the clock pulses or the timing information could be produced outside the refresh controller 18 and input thereto.

The most significant bit on line 33 is written by a write driver 34 to a refresh data memory cell in refresh data memory array 20. The cell is associated with a row in the main array 15 such that whenever that row is refreshed or accessed for an external operation, such as a read or write operation, the cell associated with that row is also accessed. The write driver 34 is under the control of logic gates 35 and 37 which implement that functionality. In that manner, a predetermined portion of the timing information is stored so as to be associated with the address for the row which has been refreshed or accessed.

A row counter 36 is responsive to the timing circuit 30. The row counter 36 produces a sequence of numbers corresponding to a sequence of addresses to be checked to determine if a refresh is required for any of the addresses. The count (address) produced by the row counter 36 is input to a row decoder 40 through a select circuit 38, the operation of which will be described in greater detail hereinbelow. The address output by the row counter 36 is also input to the row decoder 41 through a second select circuit 39, the operation of which will be described in greater detail hereinbelow. The row decoder 40 services the refresh data array 20 while the row decoder 41 services the main array 15. The select circuit 38 normally connects the output of row counter 36 to row decoder 40.

The row decoder 40 decodes the addresses produced by the row counter 36 so as to sequence through the refresh data memory cells. As each refreshed data memory cell is accessed, it outputs the stored timing information to a logic gate 42. Logic gate 42 also receives the current value of the most significant bit available on line 33, and from the logical comparison of the two, produces a refresh signal 43 indicative of whether a refresh is required. In the embodiment shown in FIG. 2, when the refresh signal 43 has a value of zero, a refresh of the row associated with that refresh data memory cell may be required.

Two logic gates 44 and 46 are provided. The gates 44 and 46 logically combine the bits output by the counter 28, other than the most significant bit, to determine the urgency of the refresh. A logic gate 48 receives the refresh signal 43 and the signal output by the gate 46. A logic gate 50 receives the refresh signal 43, the signal output by the gate 44, and an external signal available at an input terminal 52 which is indicative of a pending external operation to be performed on one of the rows within the main memory array 15. The address corresponding to that row for which there is a pending external operation is input to the select circuit 38 and the second select circuit 39 through an input terminal 54. A logic gate 56 receives the signal output by the gate 48 and the signal output by the gate 50. The output of the logic gate 56 is input to the logic gate 35. The logic gate 35 also receives the output of the logic gate 37. The logic gate 37 receives as input the signal at input terminal 52 indicating that an external operation is pending as well as the output from logic gate 56. The output of logic gate 37 is used as a control input for select circuit 38 while the output of logic gate 56 is used as a control input for the select circuit 39.

The logic gates 48, 50, and 56 form an arbitration circuit. If the refresh circuit 43 indicates that a refresh is desired, but the refresh is of a low priority, as indicated by gates 44 and 46, then any pending external operation will be performed. A signal produced by logic gate 37 causes select circuit 38, which normally inputs the signal produced by row counter 36 to the row decoder 40, to instead input the external address for which the external operation is pending to the row decoder 40. The select circuit 39 normally inputs the external address available on input terminal 54 to the row decoder 41. In that manner, both row decoders 40 and 41 receive the same address so that the pending external operation is performed on the main array 15 and, by operation of logic gate 35, the write driver 34 writes the current value of the most significant bit into the cell corresponding to the row identified by row decoder 40.

Should the refresh signal 43 indicate that a refresh is desirable, and the refresh is a high priority, as indicated by gates 44 and 46, then the arbitration circuit and the gate 37 will operate such that the output of the row counter 36 is input to both row decoders 40 and 41. Simultaneously, logic gate 35 enables write driver 34 so that as the refresh takes place, the write driver 34 writes the current value of the most significant bit to the cell associated with the row being refreshed.

In that manner, the main memory array 15 is only exposed to the refresh address produced by row counter 36 when required. That leaves the main memory array 15 available most of the time to respond to external operations thereby minimizing excess latency, i.e., the time it takes to fetch the first random piece of data.

Referring to FIGS. 3A & 3B there is illustrated a spread sheet from which it can be seen that the main memory array 15 receives the address derived from the row counter 36 only when there is a need to refresh, i.e., if the refresh is a high priority. The output of the row counter 36 is also input to the row decoder 41 if there is a low priority but no pending external request.

Completing the description of the refresh controller 18 of FIG. 2, an output gate 58 may be provided which produces a ready signal 60 whenever the arbitration circuit determines that the external request should be serviced, and that operation has been completed.

In FIG. 4A, there is shown a table having columns for sequence references, the value of a 3-bit counter, the operation which is performed (if any), the elapsed time, and comments. In table 4A, two assumptions are made. The first assumption is that there is a 16 ms refresh requirement. The second assumption is that the gates 44 and 46 of FIG. 2 are not provided so that a determination of low priority and high priority is not made. At sequence reference 5, the most significant bit of the counter has changed so that a refresh can occur at any time. At the next sequence reference, reference 6, the refresh occurs and the inverse of the most significant bit is written to the refresh data memory cell associated with that row. At sequence reference 7, the counter wraps. Because there is a zero stored in the refresh data memory cell, and the counter has wrapped so that the most significant bit is now zero, too much time will elapse before there is a mismatch between the stored most significant bit and the current most significant bit of the counter as shown by sequence reference 12. Thus, the scheme represented by FIG. 4A is not adequate.

Turning to FIG. 4B, the table in 4B represents the operation of the refresh controller shown in FIG. 2, but with a 3-bit counter for counter 28. The logic gates 44 and 46 are provided to enable the low/high refresh priority scheme to be implemented. As seen from FIG. 4B, refresh targets are met, but with a somewhat wider divergence from the optimum refresh time than if a counter greater than a 3-bit counter were used. For example, refresh could have occurred as soon as 13.56 ms, or 11.625 ms during the first pass through.

FIG. 5 is a table illustrating refresh times for the refresh controller FIG. 2 assuming the use of the illustrated 4-bit counter 28 and the logic gates 44 and 46 to provide the distinction between low and high priority refreshes. FIG. 5 illustrates that the use of a 4-bit counter reduces the variability seen in FIG. 4 arising from the use of a 3-bit counter.

Figure 6:
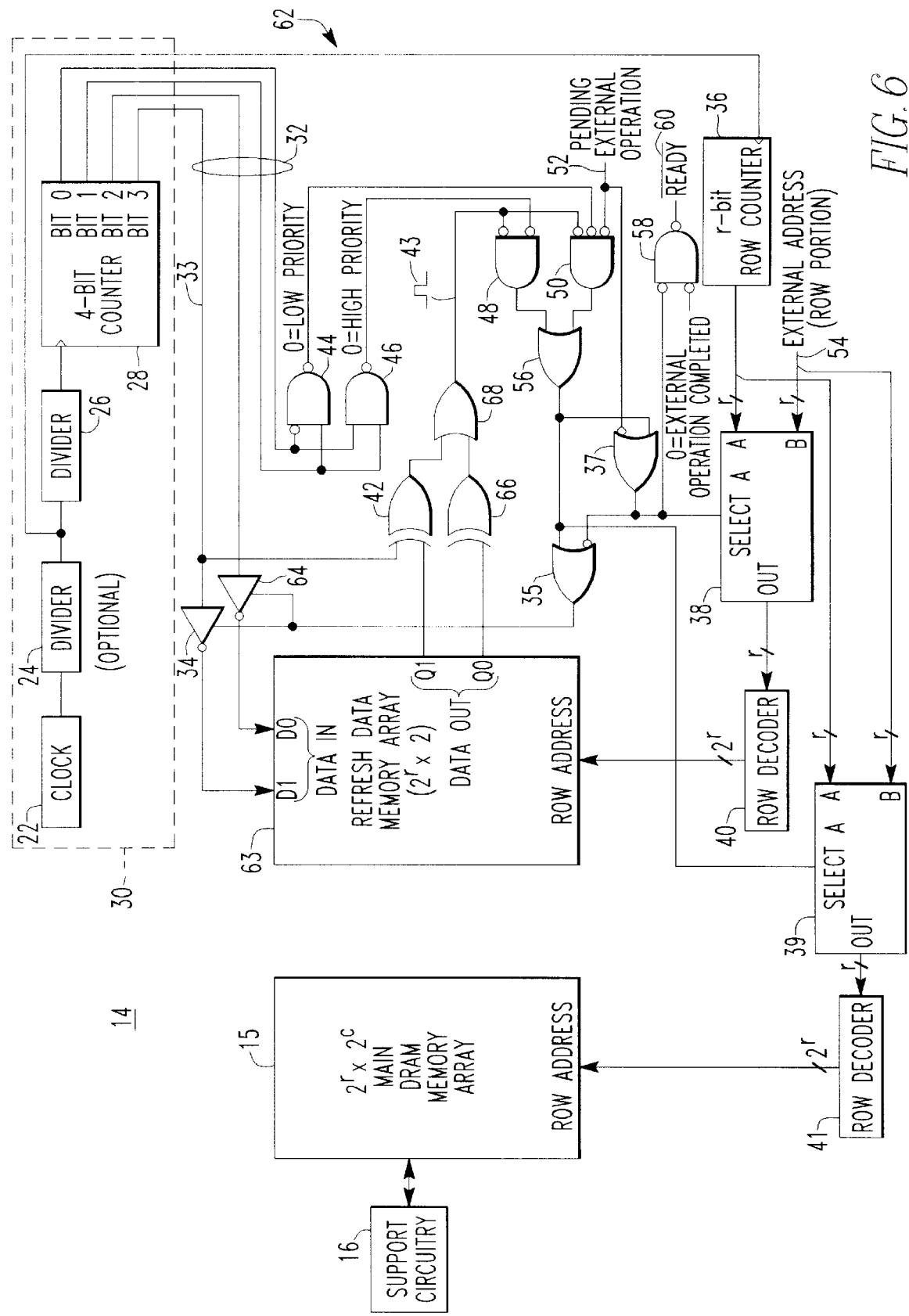
FIG. 6 illustrates a refresh controller constructed according to the teachings of the present invention and which provides two bits of refresh data per row.

In FIG. 6, a refresh controller 62 constructed according to the teachings of the present invention is illustrated. In FIG. 6, components performing the same function as those illustrated in FIG. 2 are provided with the same reference numeral.

In FIG. 6, not only is the most significant bit written to the array 63 through the use of write driver 34, but the next most significant bit is written through the use of a second write driver 64. Because of that, two additional gates 66, 68 are required to perform the necessary comparison of the stored portion of the timing information to the current value of the timing information. Logic gate 66 is responsive to the stored next most significant bit and the current value of the next most significant bit. The logic gate 68 is responsive to the gates 42 and 66 for producing the refresh signal 43. The refresh controller 62 illustrated in FIG. 6 operates in a similar manner as the refresh controller 18 illustrated in FIG. 2, except with less variability in the refresh times as is illustrated in FIG. 7. It should be noted that the clock input to the counter 28 is faster for the circuits of both FIG. 2 and FIG. 6 than would otherwise be possible if no refresh data memory were provided. That is reflected in the spreadsheets of FIGS. 4, 5, 7, and 8.

The 2-bit refresh data memory array 63 of FIG. 6 provides much less variability in refresh period than does the 1-bit refresh data memory array 20 of FIG. 2 as seen by a comparison of the tables of refresh times of FIG. 7 (corresponding to refresh controller 62) with the refresh times of FIG. 8 (corresponding to refresh controller 18). Those examples show when the first refresh would occur. The 2-bit refresh controller 62 of FIG. 6 performs much better than the 1-bit refresh controller 18 of FIG. 2 when data is written to the DRAM when the counter is not zero (i.e., 15.5 ms refresh vs. 9.69 ms refresh, respectively). The penalty, though, is larger die area because two times the memory bits are needed for the refresh data memory array 63.

Memory and bandwidth loss due to refresh operations are minimized as a result of the present invention because the present invention prioritizes memory operations above refresh operations except when refreshing a device becomes time critical. Non-intelligent refresh controls blindly refresh whole rows each refresh period, whether or not the operation is necessary. That reduces memory availability. That problem is solved in the present invention by renewing the refresh data memory cell contents whenever the row is accessed, thus reducing the frequency of refresh. For example, in a DRAM used as video memory, the entire array is accessed regularly. If the frequency of reading the DRAM is sufficient, refresh would never be required. The intelligent refresh controller of the present invention would not generate refresh signals under those circumstances. A significant potential application for the present invention is the use of a memory device requiring refresh and an application that has no provision for refresh generation. Such an application is cache memory, in which latency reduction and memory availability are vitally important.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A device for generating a refresh signal for use in a dynamic memory having an array of memory cells organized according to addresses, said device comprising:
    a refresh data memory array;
    a write driver circuit responsive to a refresh signal and timing information for writing at least a portion of the timing information in said refresh data memory array according to addresses corresponding to addresses used in the array of memory cells;
    a circuit for reading the written timing information from said refresh data memory array corresponding to certain of said addresses; and
    a logic circuit responsive to the present value of the timing information and said read timing information for producing said refresh signal indicative of when a refresh is required.

2. The device of claim 1 wherein said refresh data memory array has a single column and the same number of rows as the array of memory cells.

3. The device of claim 1 wherein said refresh data memory array has two columns and the same number of rows as the array of memory cells.

4. The device of claim 1 wherein said refresh data memory array is part of the array of memory cells.

5. The device of claim 1 wherein said refresh data memory array includes a refresh memory array separate from the array.

6. The device of claim 1 wherein said circuit for reading includes an address generator for generating a plurality of addresses, a decoder circuit responsive to said generated addresses, and a select circuit interposed between said address generator and said decoder circuit.

7. The device of claim 6 additionally comprising an arbitration circuit responsive to said refresh signal, an external signal indicative of a pending external operation to be performed on a selected address within the array of memory cells, and the timing information, and wherein said select circuit additionally receives the selected address, said select circuit being responsive to said arbitration circuit for selecting one of said address produced by said address generator and the selected address.

8. The device of claim 1 additionally comprising a timing circuit for producing the timing information, said timing circuit including a source of clock pulses, a divider responsive to said source of clock pulses, and a counter responsive to said divider for producing the timing information.

9. The device of claim 8 wherein said counter includes a four bit counter.

10. The device of claim 8 wherein said counter includes a three bit counter.

11. The device of claim 8 wherein the timing information includes a multi-bit signal, and wherein said timing information being written includes certain of said bits of said multi-bit signal.

12. The device of claim 11 wherein said timing information being written includes the most significant bit of said multi-bit signal.

13. The device of claim 11 wherein said timing information being written includes the two most significant bits of the multi-bit signal.

14. A device for generating a refresh signal for use in a dynamic random access memory having an array of memory cells organized according to addresses, comprising:
 a timing circuit for producing timing information related to the refresh rate of the memory cells of the array;
 a circuit, responsive to a refresh signal, for storing at least a portion of said timing information according to addresses corresponding to addresses used in the array of memory cells;
 a read circuit for reading said stored timing information corresponding to certain of said addresses; and
 a logic circuit responsive to the present value of said timing information and said read timing information for producing said refresh signal.

15. The device of claim 14 wherein said read circuit includes an address generator for generating a plurality of addresses, a decoder circuit responsive to said generated addresses, and a select circuit interposed between said address generator and said decoder circuit.

16. The device of claim 15 additionally comprising a second logic circuit responsive to said timing circuit for producing signals indicative of the urgency of a refresh operation, and wherein the input of said refresh signal to said circuit for storing at least a portion of said timing information is dependent upon the urgency of a refresh operation.

17. The device of claim 16 wherein said timing information includes a multi-bit signal, and wherein said timing information being stored includes certain of said bits of said multi-bit signal, and wherein said second logic circuit includes a plurality of logic gates responsive to the bits of said multi-bit signal not being stored.

18. A dynamic memory, comprising:
 an array of memory cells organized according to addresses;
 a first circuit for performing external operations on addresses within said array of memory cells; and
 a refresh controller for producing refresh signals based on each addresses need to be refreshed, wherein said refresh controller includes:
 a refresh data memory array;
 a timing circuit for producing timing information related to the refresh rate of the cells of said array;
 a write driver circuit, responsive to the refresh signal and a request for the performance of an external operation on a selected address in said array of memory cells, for writing at least a portion of said timing information to said refresh data memory array according to addresses corresponding to addresses used in said array;
 a counter, responsive to said timing circuit, for generating a plurality of addresses;
 a read circuit for reading the written timing information from said refresh data memory array in response to said generated addresses;
 a logic circuit responsive to said timing information read from said refresh data memory array and the present value of said timing information for producing said refresh signal indicative of when a refresh is required;
 an arbitration circuit for selecting one of said refresh signal and said request for the performance of an external operation; and
 a select circuit responsive to said arbitration circuit for selectively conducting one of said generated address and said selected address to said first circuit and said write driver circuit.

19. The dynamic memory of claim 18 additionally comprising a second logic circuit responsive to said timing circuit for producing signals indicative of the urgency of a refresh operation, and wherein said arbitration circuit is responsive to said signals indicative of the urgency of a refresh operation.

20. The dynamic memory of claim 18 wherein said timing circuit includes a source of clock pulses, a divider responsive to said source of clock pulses, and a counter responsive to said divider for producing said timing information.

21. The dynamic memory of claim 20 wherein said counter includes a multi-bit counter and said timing information includes a multi-bit signal, and wherein said timing information being written includes certain of said bits of said multi-bit signal.

22. The dynamic memory of claim 21 wherein said timing information being written includes the most significant bit of said multi-bit signal.

23. The dynamic memory of claim 21 wherein said timing information being written includes the two most significant bits of said multi-bit signal.

24. A method of determining when a refresh is required for an address within a dynamic memory having an array of memory cells organized according to addresses, comprising the steps of:

producing timing information related to the refresh rate of the memory cells of the array;

storing at least a portion of said timing information in association with certain of the addresses within the array of memory cells;

updating the timing information stored in association with an address whenever an operation is performed on the address;

generating a plurality of addresses to be checked to determine if a refresh is required for any of the addresses;

comparing the present timing information to said timing information stored in association with each of the generated plurality of addresses; and producing a refresh signal indicative of when a refresh is required in response to said comparison.

25. The method of claim 24 wherein said step of producing timing information includes the step of producing a multi-bit timing signal, and wherein said step of storing at least a portion of said timing information includes the step of storing certain of said bits of said multi-bit signal.

26. The method of claim 25 wherein said step of storing certain of the bits of said multi-bit signal includes the step of storing the most significant bit of said multi-bit signal.

27. The method of claim 25 additionally comprising the step of evaluating the non-stored bits of the multi-bit signal to determine the urgency of the need for a refresh.

28. The method of claim 27 additionally comprising the step of arbitrating between a pending external operation and a refresh based on the refresh signal in response to the evaluation of the urgency of the need for a refresh.

29. A method of refreshing a dynamic memory, comprising the steps of:

generating a plurality of addresses to be checked to determine if a refresh is required for any of the addresses;

storing timing information indicating when an operation has been performed on a memory element;

comparing the stored timing information to current timing information to produce a refresh signal;

arbitrating between a request for an external operation and a refresh indicated by said refresh signal; and performing one of the refresh and external operation based on said arbitration step.

30. The method of claim 29 wherein said step of comparing includes the step of comparing the current timing information to said timing information stored in association with each of the generated plurality of addresses.

31. A system, comprising:

a microprocessor;

a dynamic memory under the control of said microprocessor, said dynamic memory having, an array of memory cells organized according to addresses;

a first circuit for performing external operations on addresses within said array of memory cells; and a refresh controller for producing refresh signals based on each addresses need to be refreshed, wherein said refresh controller includes:

a refresh data memory array;

a timing circuit for producing timing information related to the refresh rate of the cells of said array;

a write driver circuit, responsive to the refresh signal and a request for the performance of an external operation on a selected address in said array of memory cells, for writing at least a portion of said timing information to said refresh data memory array according to addresses corresponding to addresses used in said array of memory cells;

a counter, responsive to said timing circuit, for generating a plurality of addresses;

a read circuit for reading the written timing information from said refresh data memory array in response to said generated addresses;

a logic circuit responsive to said timing information read from said refresh data memory array and present current value of said timing information for producing said refresh signal indicative of when a refresh is required;

an arbitration circuit for selecting one of said refresh signal and said request for the performance of an external operation; and a select circuit responsive to said arbitration circuit for selectively conducting one of said generated address and said selected address to said first circuit and said read circuit.

32. A method of refreshing a dynamic memory, comprising the steps of:

storing timing information indicating when an operation has been performed on a memory element, including storing at least a portion of the timing information in association with certain addresses within the array;

comparing the stored timing information to current timing information to produce a refresh signal;

arbitrating between a request for an external operation and a refresh indicated by said refresh signal; and performing one of the refresh and external operation based on said arbitration step.

33. A method of refreshing a dynamic memory, comprising the steps of:

storing timing information indicating when an operation has been performed on a memory element;

comparing the stored timing information to current timing information to produce a refresh signal;

calculating urgency of need for a refresh from the timing information;

arbitrating between a request for an external operation and a refresh indicated by said refresh signal, said arbitrating being additionally responsive to the calculated urgency of need for a refresh; and performing one of the refresh and external operation based on said arbitration step.

* * * * *

UNITED STATES PATENT AND TRADEMARK OFFICE
CERTIFICATE OF CORRECTION

PATENT NO. : 5,890,198
DATED : 30 March 1999
INVENTOR(S) : J. Thomas Pawlowski

It is certified that error appears in the above-identified patent and that said Letters Patent is hereby corrected as shown below:

Column 7, Line 11, after "array" insert --of memory cells--

Signed and Sealed this

First Day of February, 2000

Attest:

Q. TODD DICKINSON

*Attesting Officer*   *Acting Commissioner of Patents and Trademarks*